(12) United States Patent
Gueguen et al.

(10) Patent No.: US 11,087,051 B2
(45) Date of Patent: Aug. 10, 2021

(54) DESIGNING A MULTI-PHYSICS SYSTEM

(71) Applicant: DASSAULT SYSTEMES, Velizy Villacoublay (FR)

(72) Inventors: Thierry Gueguen, Velizy Villacoublay (FR); Laurent Le Goff, Brest (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 0 days.

(21) Appl. No.: 16/731,639

(22) Filed: Dec. 31, 2019

(65) Prior Publication Data

US 2020/0210634 A1 Jul. 2, 2020

Related U.S. Application Data

(63) Continuation of application No. 14/970,164, filed on Dec. 15, 2015, now Pat. No. 10,671,770.

(30) Foreign Application Priority Data

Dec. 23, 2014 (EP) .................................. 14307165

(51) Int. Cl.
*G06F 30/20* (2020.01)
*G06F 3/0484* (2013.01)

(52) U.S. Cl.
CPC ............ *G06F 30/20* (2020.01); *G06F 3/0484* (2013.01); *G06F 2203/04806* (2013.01)

(58) Field of Classification Search
CPC ...... G06F 30/20; G06F 30/00; G06F 30/0484; G06F 17/50; G06F 2203/04806; G06F 17/5009

USPC ............................................................ 703/1
See application file for complete search history.

(56) References Cited

U.S. PATENT DOCUMENTS

| | | | | |
|---|---|---|---|---|
| 8,392,151 B1* | 3/2013 | Grace | .................. | G06F 3/0481 |
| | | | | 703/2 |
| 9,182,948 B1* | 11/2015 | O'Riordan | ......... | G05B 19/0426 |
| 2008/0144656 A1* | 6/2008 | Frishberg | ................ | H04L 43/18 |
| | | | | 370/466 |
| 2012/0109591 A1* | 5/2012 | Thompson | .............. | G06F 30/00 |
| | | | | 703/1 |

(Continued)

OTHER PUBLICATIONS

Elmqvist, Hilding et al., "Simulator for Dynamical Systems Using Graphics and Equations for Modeling", Jan. 1989, IEEE. (Year: 1989).*

(Continued)

*Primary Examiner* — Cedric Johnson
(74) *Attorney, Agent, or Firm* — Oblon, McClelland, Maier & Neustadt, L.L.P.

(57) ABSTRACT

A method, performed by a computer system, for designing a multi-physics system including the steps of displaying a block diagram representation of the multi-physics system, including blocks that each correspond to a respective sub-system of the multi-physics system, and, between the blocks, links that correspond to multi-physics connections between the respective sub-systems, and upon a zoom command, sent by a user, displaying a preview of a block diagram representation of at least one respective sub-system, the displaying of the preview being controlled by the detection, by the computer system, of the zoom command. Such a method improves the design of a 3D modeled object.

12 Claims, 4 Drawing Sheets

(56) References Cited

U.S. PATENT DOCUMENTS

2012/0330619 A1* 12/2012 Ahmed .................. G06F 30/30
 703/1
2013/0031508 A1* 1/2013 Kodosky ................ G06F 3/041
 715/800
2014/0108985 A1* 4/2014 Scott .................. G05B 19/4188
 715/771

OTHER PUBLICATIONS

European Search Report issued in European Patent Application No, 14307165.2-1972 dated Jun. 23, 2015.
Elmqvist, Hilding et al. "Simulator for Dynamical Systems Using Graphics and Equations for Modeling", 1989, IEEE Control Systems Society Third Symposium on Computer-Aided Control System Design, IEEE (Year: 1989).

* cited by examiner

DESIGNING A MULTI-PHYSICS SYSTEM

CROSS-REFERENCE TO RELATED APPLICATIONS

This application is a continuation application of, and claims the benefit of priority under 35 U.S.C. § 120 from U.S. application Ser. No. 14/970,164, filed Dec. 15, 2015, herein incorporated by reference, which claims the benefit of priority under 35 U.S.C. § 119 or 365 to European Application No. 14307165.2, filed Dec. 23, 2014. The entire teachings or the above application(s) are incorporated herein by reference.

FIELD OF THE INVENTION

The invention relates to the field of industrial design, and notably to a method, program and computer system for designing a multi-physics system.

BACKGROUND

A number of computer systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design computer systems, the graphical user interface plays an important role as regards the efficiency of the technique. These techniques may be embedded within Product Lifecycle Management (PLM) computer systems. PLM refers to a business strategy that helps companies to share product data, apply common processes, and leverage corporate knowledge for the development of products from conception to the end of their life, across the concept of extended enterprise.

The PLM solutions provided by DASSAULT SYSTEMES (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the solution delivers an open object model linking products, processes, resources to enable dynamic, knowledge-based product creation and decision support that drives optimized product definition, manufacturing preparation, production and service.

Many computer systems allow the use of block diagrams, which is now very popular to model and display multi-physics systems. Block diagrams provide a schematic and easy-to-apprehend representation of the division of a multi-physics global system into its sub-systems and the multi-physics connections between said sub-systems. Known solutions include various tools enabling navigation in complex multi-level block diagrams (e.g. SysML based tools such as IBM Rhapsody, Atego Studio and Sparx Entreprise Architect or The Mathworks Simulink, all registered trademarks), which notably propose a simple double-clicking to explore a lower level and a user intention to switch back to a higher level.

Within this context, there is still a need for an improved solution to design a multi-physics system. Notably, improving the ergonomics of existing block diagram design solutions is of particular interest.

SUMMARY OF THE INVENTION

It is therefore provided a method, performed by a computer system, for designing a multi-physics system. The method comprises the step of displaying a block diagram representation of the multi-physics system. The block diagram representation includes blocks that each correspond to a respective sub-system of the multi-physics system, and, between the blocks, links that correspond to multi-physics connections between the respective sub-systems. The system also comprises the step of, upon a zoom command, sent by a user, displaying a preview of a block diagram representation of at least one respective sub-system. The displaying of the preview is controlled by the detection, by the computer system, of the zoom command.

The method may comprise one or more of the following:
- the preview is displayed inside the block that represents the respective sub-system;
- the zoom command is sent with a pointing device, the focus position of the zoom being specified by a location pointed by the pointing device, the displaying of the preview being further controlled by the detection, by the computer system, of a correspondence between the focus position of the zoom and the inside of the block that represents the respective sub-system;
- the intensity of the zoom is continuously increased by repetition of a predetermined action with the pointing device, the preview being progressively displayed as the intensity of the zoom is increased
- the method further comprises the step of displaying the block diagram representation of the sub-system, and of stopping the displaying of the block diagram representation of the multi-physics system, upon detection, by the computer system, of the intensity of the zoom reaching a respective predetermined threshold;
- the displaying of a block diagram representation includes loading respective graphical data in a graphical processing unit of the computer system, and the stopping of a displaying of a block diagram representation includes unloading the respective graphical data from the graphical processing unit;
- transparency of the block diagram representation of the multi-physics system is gradually increased as the intensity of the zoom is increased;
- the display is re-centered on the block diagram representation of the respective sub-system, upon detection, by the computer system, of the intensity of the zoom reaching the threshold respective to the stopping of the displaying of the block diagram representation of the multi-physics system;
- the method further comprises editing the respective sub-system while displaying its block diagram representation;
- transparency of the preview is gradually decreased as the intensity of the zoom is increased; and/or
- the displaying of the preview is further controlled by the detection, by the computer system, of the intensity of the zoom reaching a respective threshold.

It is further provided a computer program comprising instructions for performing the method.

It is further provided a computer readable storage medium having recorded thereon the computer program.

It is further provided a computer system comprising a memory having recorded thereon the computer program, a graphical user interface, a pointing device, and a processor coupled to the memory, to the graphical user interface and to the pointing device and configured to perform the method.

It is further provided an industrial product corresponding to a multi-physics system designed by the method.

It is further provided a method for manufacturing the industrial product, comprising the steps of designing a multi-physics system that corresponds to the industrial product according to the above design method, and then manufacturing the industrial product based on the designed multi-physics system.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
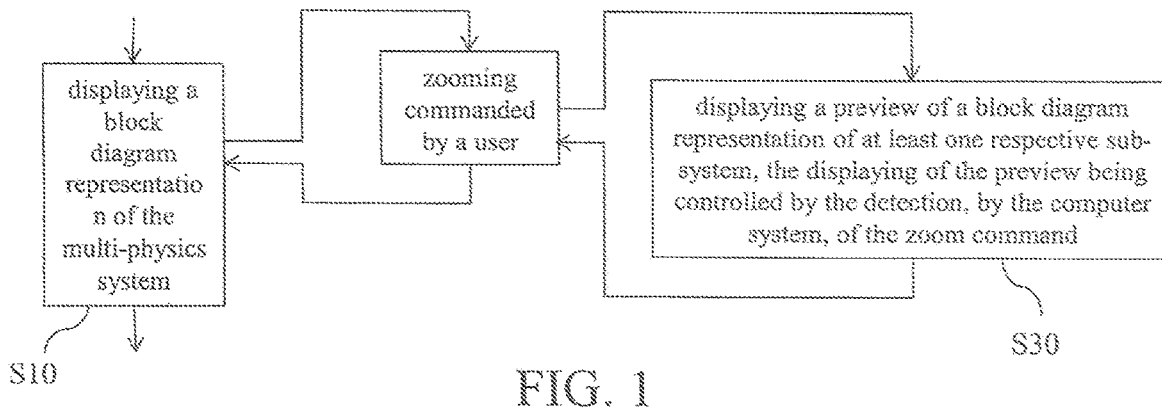
FIG. 1 shows a flowchart of an example of the method.

FIG. 1 shows a flowchart of an example of the method for designing a multi-physics system (via a computerized modeled object that represents said multi-physics system). The data forming the modeled object include a hierarchical (e.g. tree) representation of the modeled object, the root node (i.e. first layer/level) representing the multi-physics system and other nodes (i.e. lower layers/levels) representing respective sub-systems (being understood that each sub-hierarchy can be viewed as a starting hierarchy itself), and data associated to a block diagram representation of (e.g. all) nodes/layers. As represented on FIG. 1, the method comprises a step of displaying S10 a block diagram representation of the multi-physics system (thus, a block diagram representation of the root node). The method also comprises a step of displaying S30, upon a zoom (in) command sent by a user (the user requesting a zoom in the block diagram displayed at S10), a preview of a block diagram representation of at least one respective sub-system of the multi-physics system (thus, a child node of the root node). The displaying of the preview is controlled by the detection, by the computer system, of the zoom (in) command. Such a method improves the design of a multi-physics system.

Notably, the method first offers all known advantages related to the use of a block diagram representation, in specific for the design and the display of a multi-physics system: flexibility, simplicity, handiness, improved ergonomics, easy-to-apprehend representation, particular well-adaptation to the object being designed. As mentioned above, block diagram representations have gained popularity over the years such that specialists of block diagram designing have emerged and are now frequently involved in the industrial process. Software solutions dedicated to this specific kind of designing are thus being used and developed, and the method lies within this specific software technology. Then, the method offers a very interesting feature for the user of such a software, that is, the displaying at S30 of a preview of a block diagram representation of at least one respective sub-system. The information conveyed by the preview is very useful to the user, who can immediately apprehend a sub-system of the multi-physics system (thanks to visualizing the preview displayed at S30), directly from the context of the global system (i.e. the multi-physics system displayed at S10), the displaying S10 and S30 being (at least at some point) simultaneously performed. This information is conveyed to the user at a relatively low cost (preview Vs full-view). Moreover, this information is reached by the user via a user-machine interaction that is particularly easy, intuitive, and ergonomic. Indeed, the method makes a link between a zoom command sent by a user to the computer system and the displaying of the preview at S30, the displaying S30 being controlled by the detection of the zoom command by the computer-system. The specific use of the zoom command to trigger the displaying S30 of the preview is particularly well-adapted. Indeed, all designers who perform a design based on a graphical representation of their design (the displayed block diagram representation of the multi-physics system in the present case) use the zoom in command when they want to see more visual details in what is being displayed. The Inventors have taken advantage of this specificity of user-machine interaction in the context of graphical design to associate to the same zoom command an additional functionality, and not any functionality, but a functionality that tests have shown to be a particularly appropriate one (that is, the displaying of the preview).

The method is computer-implemented. Indeed, the steps of the method are executed by the computer system, which includes at least one computer, or any hardware alike. Thus, steps of the method are performed possibly fully automatically, or, semi-automatically. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined. In any case, the displaying at S30 involves user-computer interaction as the zoom is commanded by the user, as explained above. However, apart from being controlled by the zoom command sent by the user, the displaying S30 of the preview may be performed fully automatically (i.e. the user does no action further to sending the zoom command).

The computer system may comprise a processor coupled to a memory, a graphical user interface (GUI), the GUI including hardware and/or software, and a pointing device (e.g. which can be seen as part of the GUI), the memory having recorded thereon a computer program comprising instructions for performing the method. A pointing device is any input/haptic interface provided by a GUI, with the specificity that the user-machine interaction offered by such a device implies that at least one location on the graphical interface is always pointed during the user-machine interaction (i.e. the computer system continuously performs computation of such location based on how the pointing device is used). The location can be the cursor position when the device is a cursor controller, e.g. a mouse, but it can also be the middle of the positions touched by two fingers when the device is a touchpad or touchscreen. In the latter case, the set of pointed locations include the two finger positions, but also the middle thereof, as the computer continuously computes said middle when the touchpad is touched by two fingers (at least when the two fingers are moved—during a zoom for example). The memory may also store a database. The database may have entries corresponding to industrial data, notably multi-physics systems' specifications, including block diagram representation specifications, for example for performing the method. The memory is any hardware adapted for such storage, possibly comprising several physical distinct parts (e.g. one for the program, and possibly one for the database). The computer system may thus be configured this way to perform the method.

The method generally processes computerized data (the computerized data specifying/defining the multi-physics system can also be called "modeled object") that comprise all specifications related to the multi-physics system and that allow performing the method, including the block diagram representation of S10 and data allowing the display of the preview at S30 (e.g. the full block diagram representation the sub-system whose preview is displayed). By extension, the expression "multi-physics system" designates the data (or "modeled object") itself.

According to the type of the computer system, the multi-physics system may be further defined by different kinds of data. The computer system may indeed be any combination of a CAD computer system, a CAE computer system, a CAM computer system, a PDM computer system and/or a PLM computer system. In those different computer systems, modeled objects are defined by corresponding data. One may accordingly speak of CAD object, PLM object, PDM object, CAE object, CAM object, CAD data, PLM data, PDM data, CAM data, CAE data. However, these computer systems are not exclusive one of the other, as a modeled object may be defined by data corresponding to any combination of these computer systems. A computer system may thus well be both a CAD and PLM computer system, as will be apparent from the definitions of such computer systems provided below.

By CAD computer system, it is meant any computer system adapted at least for designing a modeled object on the basis of a (e.g. 3D) graphical representation of the modeled object, such as CATIA. In this case, the data defining a modeled object comprise data allowing the representation of the modeled object. A CAD computer system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows a representation to be generated. Specifications of a modeled object may be stored in a single CAD file or multiple ones. The typical size of a file representing a modeled object in a CAD computer system is in the range of one Megabyte per part. And a modeled object may typically be an assembly of thousands of parts.

By PLM computer system, it is meant any computer system adapted for the management of a modeled object representing a physical manufactured product. In a PLM computer system, a modeled object is thus defined by data suitable for the manufacturing of a physical object. These may typically be dimension values and/or tolerance values. For a correct manufacturing of an object, it is indeed better to have such values.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systemes under the trademark ENOVIA®.

CAM stands for Computer-Aided Manufacturing. By CAM solution, it is meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systemes under the trademark DELMIA®.

CAE stands for Computer-Aided Engineering. By CAE solution, it is meant any solution, software of hardware, adapted for the analysis of the physical behavior of a modeled object. A well-known and widely used CAE technique is the Finite Element Method (FEM) which typically involves a division of a modeled objet into elements which physical behaviors can be computed and simulated through equations. Such CAE solutions are provided by Dassault Systemes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systemes under the trademark DYMOLA®. The multi-physics system may notably be modeled as a CAE object, e.g. having, among its data/specifications, simulation and/or analysis scripts and/or functions and/or tools/components associated to block diagrams representing respective sub-systems, that run on (i.e. take as input) the block diagram representation/model to simulate/analyze behavior of the multi-physics system.

Figure 2:
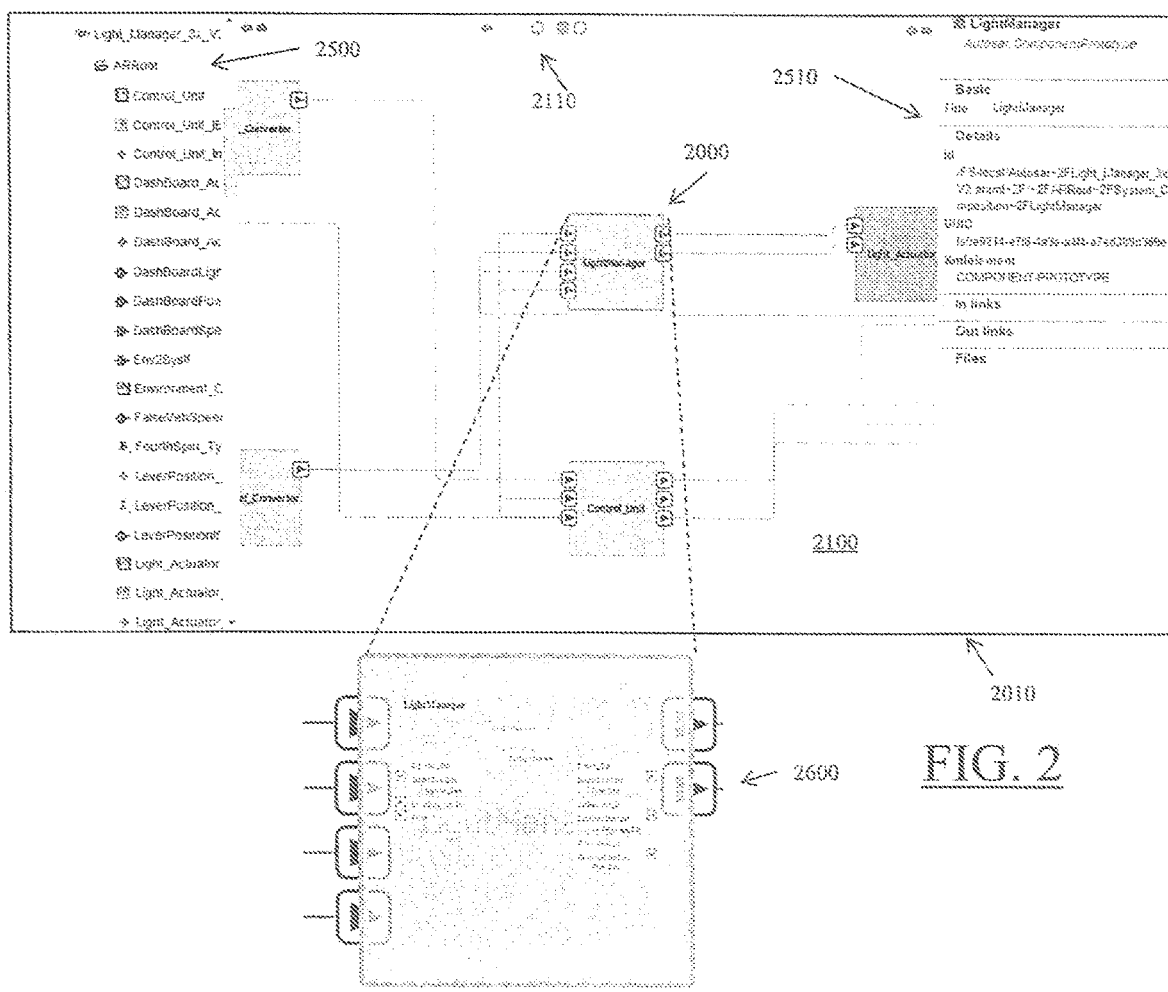
FIG. 2 shows an example of a graphical user interface of the computer system.

FIG. 2 shows an example of the GUI of the computer system, wherein the computer system is a CAE computer system.

GUI 2010 may be a typical CAD-like interface, having standard menu bars 2110. Such menu- and toolbars contain a set of user-selectable icons, each icon being associated with one or more operations or functions, as known in the art. Some of these icons are associated with software tools, adapted for editing and/or working on 2D modeled object 2100 (electrical system in the example of FIG. 2) displayed in GUI 2010, displayed 2D modeled object 2100 being for example the result of S10. The software tools may be grouped into workbenches. In operation, a designer may for example pre-select a part of object 2100 and then initiate an operation (e.g. change the dimension, color, etc.) or edit geometrical constraints by selecting an appropriate icon. The GUI may for example display data 2500 related to the displayed block 2000 (representing a Light Manager subsystem of a car in the example) if said block 2000 is selected. In the example of FIG. 2, the data 2500, displayed as a "feature tree", and their 2D representation 2000 pertain to the model of block 2000 representing the Light Manager. The GUI may further show the detailed properties 2510 of the selected block. According to an example of the method, when zooming on the selected block, the underlying structure of this block appears progressively, showing more and more details, as represented by view 2600. A cursor may be controlled by a haptic device to allow the user to interact with the graphic tools. Alternatively, a sensitive screen may be provided.

Figure 3:
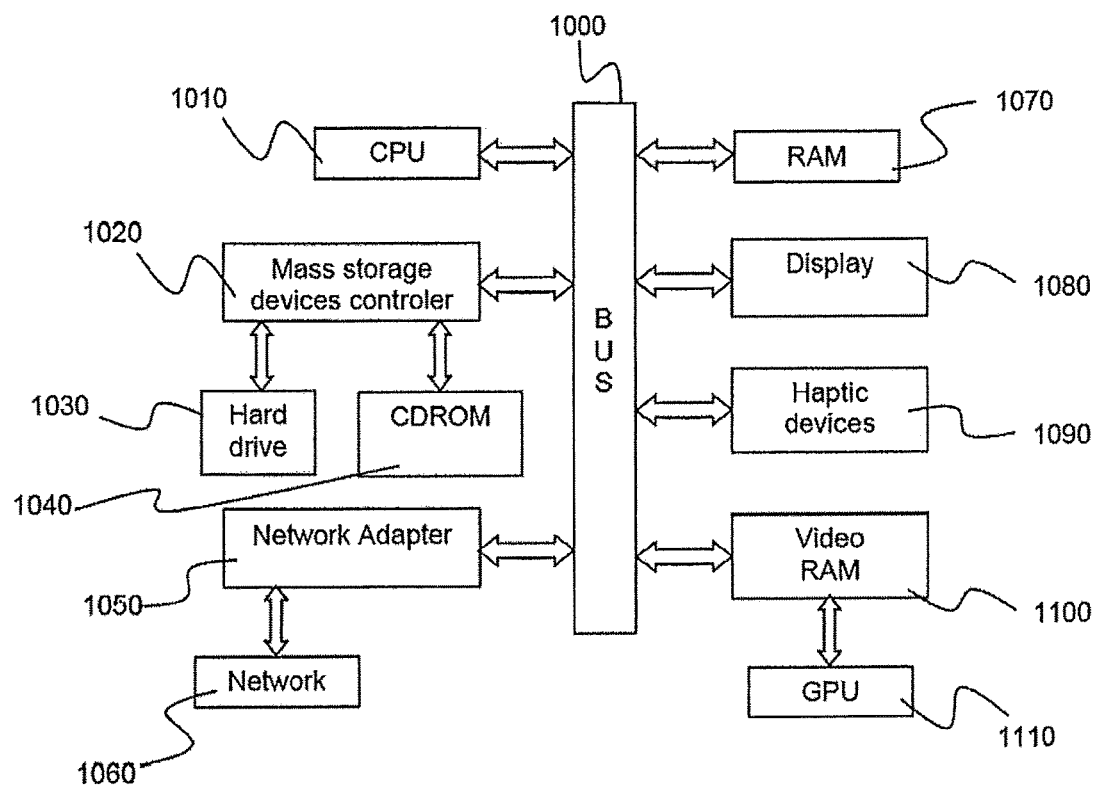
FIG. 3 shows an example of the computer system.

FIG. 3 shows an example of the computer system, wherein the computer system is a client computer system, e.g. a workstation of a user.

The client computer system of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include haptic devices 1090, such as cursor control device, a keyboard or the like, including the above-mentioned pointing device. The pointing device may be a cursor control device (e.g. mouse) provided with a (physical) scroll wheel (e.g. the scrolling, e.g. up or down, sending a zoom in command to the computer system in the context of the method, as very classical in the field of computer science, e.g. the scrolling in the other direction sending a zoom out command). A cursor control device may be used in the client computer to permit the user to selectively position a cursor at any desired location on display 1080. In addition, the cursor control device allows the user to select various commands, and input control signals. The cursor control device includes a number of signal generation devices for input control signals to the computer system. Typically, a cursor control device may be a mouse, the button of the mouse being used to generate the signals. The pointing device can alternatively, or additionally (because the pointing device can include different hardware, which can be equivalently seen as the computer system having several pointing devices), be a touchpad and/or touchscreen (e.g. a touch gesture, for example the gesture of spreading or reuniting two fingers or two sets of substantially joint fingers, sending a zoom command to the computer system in the context of the method, as very classical in the field of computer science, e.g. the other action—reuniting or spreading—sending a zoom out command). The touchscreen may be display 1080, the architecture shown on the figure being merely schematic.

The computer program may comprise instructions executable by a computer, the instructions comprising means for causing the above computer system to perform the method. The program may be recordable on any data storage medium, including the memory of the computer system. The program may for example be implemented in digital electronic circuitry, or in computer hardware, firmware, software, or in combinations of them. The program may be implemented as a computer system, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage computer system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the computer system results in any case in instructions for performing the method.

"Designing a multi-physics system" designates any action or series of actions which is at least part of a process of elaborating a multi-physics system. Thus, the method may comprise creating the multi-physics system's specifications from scratch. Alternatively, the method may comprise providing specification previously created, and then simply visualizing the specifications and/or modifying the specifications. The design of a multi-physics system with a computer-aided is highly enhanced by using a block diagram representation. The computer system captures the design intent in such a way that design changes can be propagated throughout sub-systems so that the whole model can be automatically updated.

The multi-physics system may correspond to an industrial product to be manufactured in the real world subsequent to the completion of its virtual design, such as a (e.g. mechanical) part or assembly of parts, or more generally any rigid body assembly (e.g. a mobile mechanism). A CAD and/or CAE software solution allows the design of products in various and unlimited industrial fields, including: aerospace, architecture, construction, consumer goods, high-tech devices, industrial equipment, transportation, marine, and/or offshore or transportation. The multi-physics system designed by the method may thus represent an industrial product which may be a part (or the whole) of a terrestrial vehicle (including e.g. car and light truck equipment, racing cars, motorcycles, truck and motor equipment, trucks and buses, trains), a part (or the whole) of an air vehicle (including e.g. airframe equipment, aerospace equipment, propulsion equipment, defense products, airline equipment, space equipment), a part (or the whole) of a naval vehicle (including e.g. navy equipment, commercial ships, offshore equipment, yachts and workboats, marine equipment), a mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

A multi-physics system, in the meaning of the invention, is more generally any physical system whose behavior can be simulated via at least one (but often several) physical models—system of one or more equation(s)—e.g. including a mechanical model, an electrical model, a hydraulic model, a control model and/or a chemical model. A multi-physics system generally has sub-systems that are themselves multi-physics systems and that are altogether connected by physics or logics relations. A multi-physics system is thus a model to represent any physical entity, such as an electromechanical product or a hydro-mechanical product, by dividing it in sub-entities (the sub-systems) related together by physical or logical relations, such as mechanical relations (e.g. corresponding to connections for transmitting a force or movement), electrical relations (e.g. corresponding to electrical connections, for example in a circuit), hydraulic relations (e.g. corresponding to conducts that transmit fluxes), logical relation (e.g. corresponding to flows of information) and/or chemical relations. The system is called "multi-physics" because the physical or logical relations of a multi-physics system can belong to several fields of physics (although this is not necessary the case).

Owing to its structure, a multi-physics system can be efficiently and intuitively represented/modeled by a block diagram representation. A block diagram representation is associated to, as known per se, a graphical representation (e.g. 2D) of a system, with blocks/boxes (e.g. rectangles, squares and/or circles) that each correspond to a respective sub-system of the multi-physics system, and, between the blocks, links (e.g. lines/wires) that correspond to the above-mentioned multi-physics connections/relations between the respective sub-systems (thus associated to the above-mentioned equations). Each block of the block diagram represents a sub-system (e.g. a phenomena or a component of the system), which can itself be modeled by a block diagram representation (as mentioned earlier), the block diagram representation of a multi-physics system possibly designating the whole hierarchical structure of block diagrams of all sub-systems of the multi-physics system. Block diagrams are usually available to the user in large physical domain libraries. Blocks of a block diagram may thus be represented by two-dimensional shapes and usually be provided with connectors (e.g. graphically represented as ports, bullets, or filled squares) to connect them with the above-mentioned links. Blocks may be linked with other blocks by links connecting connectors. Links are represented in the shape of lines/wires (not necessarily straight). Bock diagram graphical representations allow the simulation of a mathematical model representing a system and the analyses of the response of a complex system, such as in multi-disciplinary domains.

Figure 7:
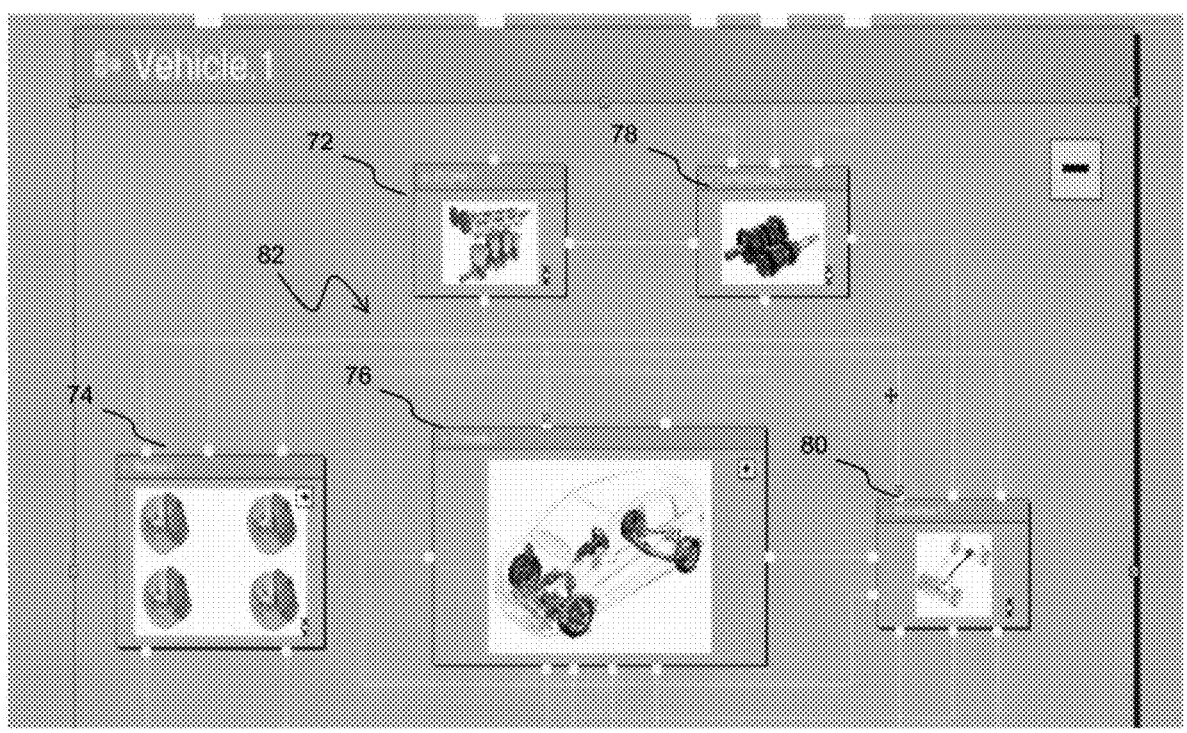

FIG. 7 shows an example of a block diagram representation of a different multi-physics system from the example of FIG. 2, a Vehicle system in the example of FIG. 7. As shown, the vehicle system is represented with Engine 72, Breaks 74, Chassis 76, Transmissions 78 and Driveline 80 sub-systems. Connections 82 are drawn in white, and they show that Chassis 76 occupies a central position in the system, and thus in the block diagram representation.

As shown on FIG. 1, the method starts by displaying at S10 such a block diagram representation, on the display device of the computer system (which can be a screen or any other display device). The block diagram representation's specifications are initially provided to the computer system for display S10 in any way known in the field of computer science. They may be part of the specifications of the multi-physics system accessed in a database, as discussed earlier. The displaying S10 may be performed throughout the method, as a background process, except in examples discussed later where it is stopped. Thus, except in those examples where such display is explicitly stopped, the block diagram representation of the multi-physics system may be continuously displayed in the design scene of the workspace of the user of the computer (at least part of the block diagram representation of the multi-physics system, when the zoom excludes some parts from the scene, the modeling data and possibly the graphical data as well, explained later, being still loaded though).

In the example of FIG. 1, while the displaying S10 is performed by the computer system, the user sends a zoom in command (the term "zoom" alone referring to a "zoom in" hereafter), that is, the user requires a zoom, which applies to a specific area of the display, in particular on a specific area of the block diagram graphical representation (i.e. the "focus position" of the zoom). The zoom command can be sent in any way known per se, for example as explained above using a scroll wheel of a haptic device and/or a finger gesture with a sensitive haptic device such as a touchscreen or a touchpad, or even by a classical interaction with a widget provided in the display (e.g. a slider or scrollbar). In case the user specifies the focus position of the zoom (in ways known per se), for example on a specific block or link of the block diagram representation, the zoom in may be obviously performed based on this focus position. If this is not the case, then the zoom in may be performed with a default focus position, such as a center of the block diagram representation or the center of the graphical design scene.

The zoom command is continuously detected by the computer system which thus performs the zoom in and accordingly updates the display S10. In the method, this detection also controls the display of other information: the display at S30 of a preview of a block diagram representation of at least one respective sub-system. By "control" it is meant, as known per se from the field of computer science and/or robotics and/or control systems, that the display S30 is performed according to a control loop in the programs running on the computer system to perform the method, the control loop taking the detection as input/condition to output the display S30, The display S30 may be performed as soon as the zoom is detected, or while such detection occurs but upon a further condition being achieved (such as in the example discussed later).

At S30 a preview of a block diagram representation of at least one respective sub-system is displayed. As mentioned above, sub-systems of a multi-physics system are multi-physics systems themselves, such that they can also be represented graphically by block diagrams, whose previews may be displayed at S30 for one or more (possibly all) the sub-systems (e.g. of the currently displayed layer). Block diagrams representations of sub-systems are thus also stored in the memory, and they or their previews are retrievable for the purpose of performing S30. In computer systems allowing the design of a multi-physics system based on a block diagram representation, as widely known, a tree-like hierarchy of sub-systems of the multi-physics systems is constantly maintained and can be browsed/explored via successive block diagram displays by the user performing the design. The browsing is classically performed by double-clicking on a block of the block diagram representation such as to access a sub-system, or on a tree representation provided in a browser/explorer outside the graphical design scene. The method lies within this context, and the displaying S30 may be a help for such browsing, as it allows the user to preview what is inside a sub-system before launching the processing/RAM costs of accessing it.

The preview of a block diagram representation and the difference between the display of a block diagram representation (e.g. at S10) and the display of a preview of a block diagram representation (e.g. at S30) are now discussed. A mentioned above, a block diagram representation may be displayed with graphical elements including rectangles, lines, circles, bullets, ports, filled squares and/or wires (and also optionally texts and/or images). The preview includes—when displayed—graphical elements of the same nature and related to the block diagram whose preview is displayed. The graphical elements of the preview are thus displayed at S30 in addition to the graphical elements of the main block diagram being displayed since S10. Indeed, the display S30 is performed while the display S10 is still being performed.

Be it the block diagram representation displayed at S10 or the block diagram representation preview displayed at S30, these data are displayed thanks to them being associated to (e.g. retrievable or computable) graphical data (e.g. including the above-mentioned graphical elements), said graphical data being loaded in the RAM of the computer system, for example in the RAM of a GPU of the computer system for the purpose of the display. The graphical data of the preview may be the same as the graphical data of the block diagram representation, or it may be smaller (from a number of data fields point of view, e.g. contain less details). In any case, when fully displayed (such as at S10), a block diagram representation is associated to data additional to the graphical data, here called "modeling data", that are loaded in the RAM of the computer system, for example in the RAM of a CPU. This modeling data allows to perform different actions on the representation, e.g. including the simulations and/or analysis mentioned earlier, and/or the edition of the block diagram representation (and thus the edition/design of the multi-physics system represented by the block diagram representation). The edition may include adding/deleting/modifying blocks and/or adding/deleting/modifying/rerouting links and/or adding/deleting/modifying the earlier mentioned connectors (that is, connectors/ports provided at the blocks for connecting them with links). The edition may be performed via user-interaction, typically graphical interaction. This is all known from the field of block diagram modeling.

When a block diagram representation is fully displayed (which implies e.g. that both the graphical data and the modeling data are loaded in the RAM), such as at S10, it can be edited as above. When only a preview of a block diagram representation is displayed (which implies that at least part of the graphical data is loaded in the RAM, but at least part, possibly all, of the modeling data is not loaded in the RAM), such as at S30, such editions are not directly/immediately possible (unless loading the corresponding data). The method thus allows a refinement of the browsing of block diagram representations allowed in the prior art, as it allows a user to visualize a sub-system before deciding to load the corresponding modeling data in order to perform editions. In an example, the method comprises iterating in any order the displaying S10, the displaying S30, the loading of modeling data of a sub-system and edition of the sub-system, being understood that the reference multi-physics system of an iteration may be the sub-system previewed and whose modeling data was then loaded at the preceding iteration. The method thus allows a user-friendly block diagram design with an efficient management of processing and RAM resources as the user-machine interaction goes.

Example options of the method that increase the ergonomics with specific user-machine interaction features are now discussed with reference to FIGS. 4-6, which show block diagrams (40, 60) displayed in the scene (respecting the same scaling for the three figures), according to an example run of the method, each scene 410 being displayed on a screen 400.

In the examples, the method is applied specifically to 2D block diagrams. These diagrams are hierarchical with no limit in the number of levels of the hierarchy (corresponding to the decomposition into sub-systems), that can also be called "layer" hereafter. Each layer is composed of any number of objects linked together to represent various kinds of relations, this all being captured by the above-detailed format of wire/lines (46, 48) and boxes/blocks (42, 44). Each block/box (42, 44) is either a terminal one, meaning that there is no information in the graphical model which provides details on the content of the box, or non-terminal one, meaning that the box contains itself another diagram. Terminal blocks may be associated to no block diagram representation at all, or to the simplest form of block diagrams (that is, the mere unique block). Non-terminal blocks typically correspond to relevant sub-systems and are typically associated with a relatively complex block diagram representation, which can thus have a meaningful preview and whose browsing would have a meaning to the user. Lines (46, 48) may connect two blocks, or more (as for line 48 who is provided for connecting a third block, not instantiated though) The examples of the method apply on any layer and are recursive. The figures arbitrarily chose and take one layer that can be called the "Upper layer" and corresponds to the multi-physics system of FIG. 1, with the only hypothesis that central box 42 is non-terminal. The content of central box 42 is called "Lower layer" and corresponds to the "sub-system" of FIG. 1. The purpose of the method is to facilitate accessing the lower layer. The user would want to access the lower layer typically to understand the details of the implementation of central box 42 of the upper layer. In the example of the figures, boxes (42, 44) are rectangular, but blocks can generally be of any shape. Similarly, on the figures the wires are of elbow type but lines can also generally be of any shape.

Example options now presented deal with navigation in complex multi-level block diagrams enabling smooth transitions between the various levels. Complex multi-level block diagrams browsers of the prior art make the hypothesis that the user has a good understanding of the global architecture and in particular knows, being at a given level, what can be found at the lower level. This is a problem when looking at very large architecture and is even more a problem when the construction of these complex block diagram is a collaborative task made by several persons (a possible option of the method). The method of the examples tackles this issue. Effects of the method grow with the complexity of the block diagram being browsed: speed is increased as the user may not have to go to the second threshold (mentioned later) if only browsing the structure briefly and introspecting in details, and efficiency is greatly improved as the user can make sure by simple previewing that the lower level he/she wants to browse is indeed the right one before displaying it fully without the upper level.

Figure 4:
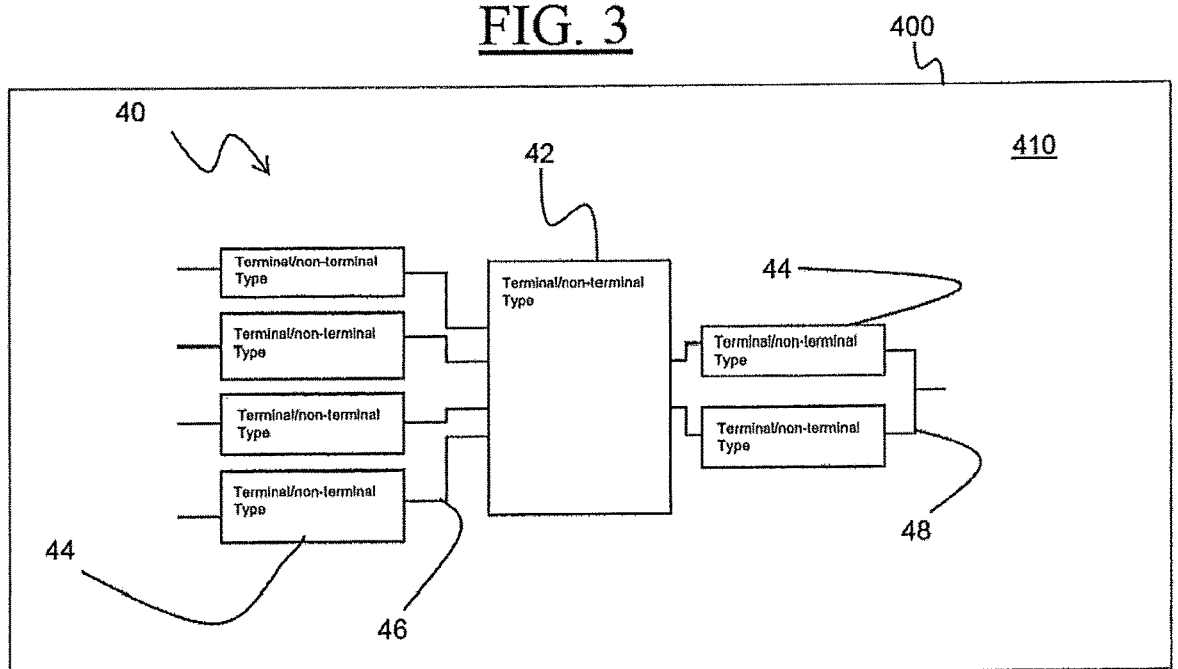
FIGS. 4, 5, 6 and 7 illustrate the method.
Figure 5:
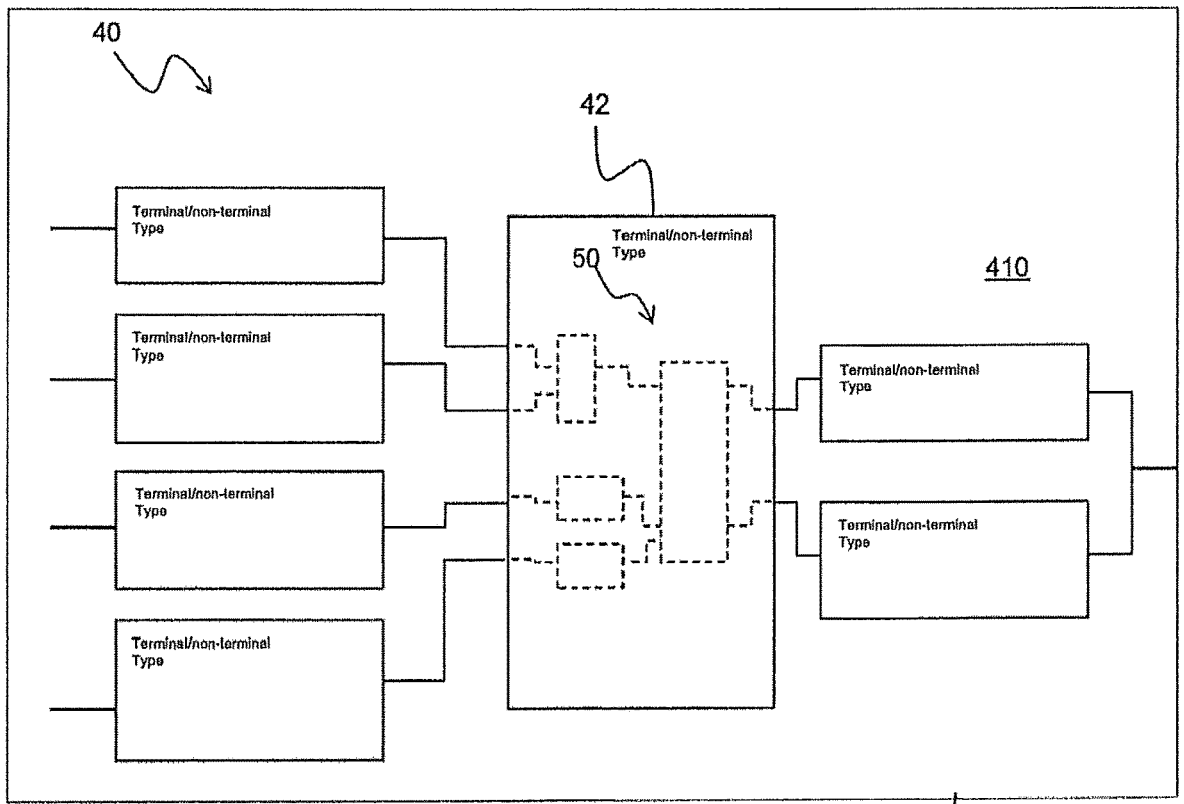

The user starts with a display S10 of a block diagram representation 40 of the multi-physics system, as shown on FIG. 4. In the example, the user sends a zoom in command which is detected and executed by the computer system which accordingly updates the display shown on FIG. 4 into the one shown on FIG. 5. As can be seen, the preview 50 of the sub-system corresponding to central block 42 that represents the respective sub-system is the only one displayed at S30, and it is displayed inside the central block 42 (as a dotted-line caption of the block diagram to which it corresponds in the case of the example). This option of the example allows an efficient use of the space taken by the whole graphical data displayed by the computer system. Indeed, in a block diagram representation the user wants to distinguish between blocks and wires efficiently. Displaying information inside blocks increases the feeling of compactness. Also, blocks are related to a sub-system as soon as S10. Displaying the preview 50 at S30 inside the block diagram corresponding to the represented sub-system allows the focus of the user's eye to stay at one sport of the display (e.g. screen).

Notably, as explained above the zoom command may be sent with a pointing device, and the focus position of the zoom may be specified by a location pointed by the pointing device. In such a case, the displaying of the preview at S30 may be further controlled by the detection, by the computer system, of a correspondence between the focus position of the zoom and the inside of the block 42 that represents the respective sub-system whose preview 50 is displayed at S30 (the focus position matches the position of the inside/interior zone of the block, e.g. as defined in the 2D plane of a screen). In other words, the computer system not only detects that a zoom command is sent by the user, but it detects where the zoom is wanted (i.e. the focus of the zoom, corresponding to the location of the pointing device while the zoom in is commanded). Furthermore, the computer system maintains a map of interiors of blocks (42, 44) of the block diagram representation 40 (such interiors and/or above-mentioned correspondence/matching being determined in any classical way, e.g. with pixel operations, e.g. corresponding to the graphical interior of the blocks), such that the computer system can recognize/detect when the zoom command is related to a specific block or not. In case it is related to a specific block, the preview corresponding to this block only is displayed S30. In the example of FIG. 5, preview 50 of block 42 is displayed at S30. This allows an efficient management of resources, by displaying the only wanted preview. Also, the user-interaction offered to the user is intuitive, the user focusing his/her eye on the spot where the interaction is operated, this spot being also the position where the information—the preview—is to be displayed, and also the spot where the sub-system related to said information was already displayed since S10 (as a block).

Now, as explained earlier, preview 50 may be displayed as soon as the user commands a zoom in focused inside block 42. However, as the intensity (i.e. the degree, power) of the zoom may be (substantially) continuously increased by (continuous) repetition of a predetermined action with the pointing device (e.g. the repetition of the scrolling or the repetition of the two fingers spreading away), the preview may be in accordance progressively displayed as the intensity of the zoom is increased. This increases flexibility of user-interaction and handiness of the system. As known from the field of user-computer interaction, a zoom in may be performed through a continuous and repetitive action. Here, the term "repetition" does not imply that the action is discretely iterated from a user point of view. Indeed, in the case of two fingers spreading away from each other, the action is substantially continuously intensified (instead of being iterated) from a user point of view. From a computer system point of view however, there is indeed a computation iteration, due to the fact that computer systems handle numeric signals only (in the case of fingers spreading away, the iteration is typically at the pixel-level). This concept, very widely known from zoom commands, is covered here by the expression "repetition of a predetermined action". So, as the intensity of the zoom is progressively increased, preview 50 is progressively displayed, meaning that it is not displayed all at once at the beginning of the zooming. The term "progressively" means that there is a progression in the display as the zoom in command is detected, the display not being simply all performed as soon as the zoom in command is detected.

Notably, the method may use predetermined thresholds to implement the progressive relation between the displaying S30 and the intensifying of the zooming in.

A first predetermined threshold may be implemented to start the displaying S30 of preview 50. When the user sends a zoom command, the computer system continuously monitors the intensity of zoom requested. As the user reaches the first threshold, the computer system detects this reaching and only then (as soon as such detection occurs) it starts the displaying S30 of preview 50. In other words, transparency of the preview is progressively decreased as the intensity of the zoom is increased. The transparency of an element to be displayed is a value associated to that element, in any computer-implemented way, and it can be binary (totally transparent, i.e. not displayed at all, or not all transparent, i.e. fully displayed), or alternatively the value can continuously/gradually decrease from totally transparent to not at all transparent. The term "gradually" means that at least one value other than "not at all transparent" and "totally transparent" is taken in the progression of the transparency. The transparency of preview S50 decreases from its maximum to its minimum, upon the intensity of the zoom first being equal to the first threshold, and then increasing until it equals a second threshold (thus corresponding to the minimum transparency of the preview). As on FIG. 5, preview 50 may be displayed with dotted lines that may be intensified (e.g. less void space between the dots) continuously/gradually as the zoom intensity is increased. Other ways of displaying the preview S50 may be implemented, such as shading or coloring, and these other ways may also be applied in a binary way or gradually (more and more shading, more and more coloring) in a similar fashion.

Now, as the user commands the zooming in, the computer system may detect at some point a second predetermined threshold (thus higher than the first threshold) being reached, this second threshold possibly being the one mentioned earlier. Upon such detection, and as soon as such detection occurs, the computer system stops the displaying S10 of the block diagram representation 40 of the system (i.e. the respective graphical data are thus unloaded from the RAM, e.g. of the GPU, and the related modeling data are also unloaded from the RAM of the computer system, e.g. CPU). According to the above definition of transparency, it can be said that transparency of the block diagram representation 40 of the multi-physics system is progressively increased as the intensity of the zoom is increased (the transparency being total upon reaching the second threshold). The progression (increasing transparency in the present case) of the transparency can be binary, or gradual as for the transparency of the preview (decreasing transparency in that case).

Figure 6:
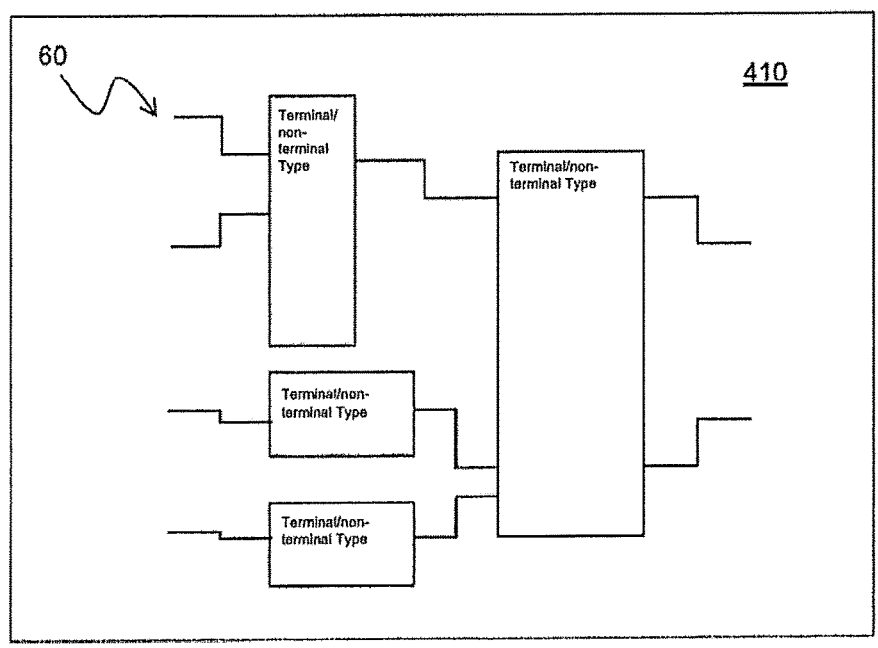

Substantially simultaneously, the computer system displays the block diagram representation 60 of the sub-system corresponding to preview 50, as shown on FIG. 6. The graphical data related to representation 60 are loaded, and the modeling data related to representation 60 are loaded as well, the method thereby allowing a user-friendly, flexible and ergonomic browsing of the multi-physics system, with possible editions of the sub-systems once displayed as on FIG. 6.

As shown on FIG. 6, the display in an example of the method is immediately re-centered on the block diagram representation 60 of the respective sub-system. Also, the display may be resized. This way, the user has the impression of visualizing a multi-physics system as when viewing FIG. 4. The method can then be re-iterated to access sub-systems shown as blocks on FIG. 6. Also, the user may go back to the upper layer of FIG. 4 with a specific command, or using a traditional explorer tree (not represented).

A zoom out command may cancel the displaying S30 of the preview, and increase transparency of the preview, and thereby play an inverse role to the zoom in command, even if the first threshold has been reached. However, when the second threshold has been reached and the display is as on FIG. 6, for coherency of the computer system and of its use, the return to the view of FIG. 4 may be impossible by a mere zoom-out. A specific command, such as a button, may then be used. This is however not an obligation.

The invention claimed is:

1. A method, performed by a computer system, for displaying a multi-physics system, the method comprising:
   loading in a random access memory ("RAM") of the computer system a block diagram representation of the multi-physics system and a preview of a block diagram representation of at least one respective sub-system; then
   simultaneously and in real time:
   displaying a block diagram of the multi-physics system, the block diagram representation including graphical elements including blocks that each correspond to a respective sub-system of the multi-physics system, and, between the blocks, links that correspond to multi-physics connections between the respective sub-systems,
   by a user, simultaneously, while the block diagram representation of the multi-physics system is displayed, and with a pointing device:
   sending a continuous zoom command, and
   pointing to a location within a graphical interior of the displayed block diagram that represents the respective sub-system, the location specifying a focus position of the zoom command,
   by the computer system, simultaneously, while the block diagram representation of the multi-physics system is displayed, and with no user action further to sending the zoom command and pointing to the location:
   continuously and simultaneously detecting:
   the zoom command and the location pointed by the user using the pointing device, and
   a correspondence between the location pointed by the user and the graphical interior of the displayed block that represents the respective sub-system, and
   displaying, within the graphical interior of the displayed block diagram that represents the respective sub-system, the loaded preview of the block diagram representation of the respective sub-system, the loaded preview of the block diagram representation of the respective sub-system including graphical elements of a same nature as the graphical elements of the displayed block diagram representation of the multi-physics system, the graphical elements of the preview being thereby displayed in addition to the graphical elements of the displayed block diagram representation of the multi-physics system, the displaying of the loaded preview being controlled by the continuous detection of the zoom command, of the location pointed by the user and of the correspondence.

2. The method of claim 1, wherein the zoom command is sent with a pointing device, the focus position of the zoom being specified by a location pointed by the pointing device, the displaying of the preview being further controlled by the detection, by the computer system, of a correspondence between the focus position of the zoom and the inside of the block that represents the respective sub-system.

3. The method of claim 2, wherein an intensity of the zoom is continuously increased by repetition of a predetermined action with the pointing device, the preview being progressively displayed as the intensity of the zoom is increased.

4. The method of claim 3, wherein the method further comprises the step of displaying the block diagram representation of the sub-system, and of stopping the displaying of the block diagram representation of the multi-physics system, upon detection, by the computer system, of the intensity of the zoom reaching a respective predetermined threshold.

5. The method of claim 4, wherein the displaying of a block diagram representation includes loading respective graphical data in a graphical processing unit of the computer system, and the stopping of a displaying of a block diagram representation includes unloading the respective graphical data from the graphical processing unit.

6. The method of claim 4, wherein transparency of the block diagram representation of the multi-physics system is gradually increased as the intensity of the zoom is increased.

7. The method of claim 4, wherein the display is re-centered on the block diagram representation of the respective sub-system, upon detection, by the computer system, of the intensity of the zoom reaching the threshold respective to the stopping of the displaying of the block diagram representation of the multi-physics system.

8. The method of claim 4, wherein the method further comprises editing the respective sub-system while displaying its block diagram representation.

9. The method of claim 3, wherein transparency of the preview is gradually decreased as the intensity of the zoom is increased.

10. The method of claim 3, wherein the displaying of the preview is further controlled by the detection, by the computer system, of the intensity of the zoom reaching a respective threshold.

11. A non-transitory data storage medium having recorded thereon a computer program comprising instructions for performing a method for displaying a multi-physics system implemented by a computer system, the method comprising:
    loading in a random access memory ("RAM") of the computer system a block diagram representation of the multi-physics system and a preview of a block diagram representation of at least one respective sub-system; then
    simultaneously and in real time:
    displaying a block diagram of the multi-physics system, a block diagram including graphical elements including blocks that each correspond to a respective sub-system of the multi-physics system, and, between the blocks, links that correspond to multi-physics connections between the respective sub-systems,
    by a user, simultaneously, while the block diagram representation of the multi-physics system is displayed, and with a pointing device:
    sending a continuous zoom command, and
    pointing to a location within a graphical interior of the displayed block diagram that represents the respective sub-system, the location specifying a focus position of the zoom command,
    by the computer system, simultaneously, while the block diagram representation of the multi-physics system is displayed, and with no user action further to sending the zoom command and pointing to the location:

continuously and simultaneously detecting:

the zoom command and the location pointed by the user using the pointing device, and a correspondence between the location pointed by the user and the graphical interior of the displayed block that represents the respective sub-system, and displaying, within the graphical interior of the displayed block diagram that represents the respective sub-system, the loaded preview of the block diagram representation of the respective sub-system, the loaded preview of the block diagram representation of the respective sub-system including graphical elements of a same nature as the graphical elements of the displayed block diagram representation of the multi-physics system, the graphical elements of the preview being thereby displayed in addition to the graphical elements of the displayed block diagram representation of the multi-physics system, the displaying of the loaded preview being controlled by the continuous detection of the zoom command, of the location pointed by the user and of the correspondence.

12. A computer system comprising:

a processor coupled to a memory, to a graphical user interface and to a pointing device, the memory having recorded thereon a computer program including instructions for displaying a multi-physics system that when executed by the processor causes the processor to be configured to:

load in a random access memory ("RAM") of the computer system a block diagram representation of the multi-physics system and a preview of a block diagram representation of at least one respective sub-system; then simultaneously and in real time:

display the block diagram representation of the multi-physics system, block diagram including graphical elements including blocks that each correspond to a respective sub-system of the multi-physics system, and, between the blocks, links that correspond to multi-physics connections between the respective sub-systems, from a user, simultaneously, while the block diagram representation of the multi-physics system is displayed, and with a pointing device:

receive a sent continuous zoom command, and receive a pointing to a location within a graphical interior of the displayed block that represents the respective sub-system, the location specifying a focus position of the zoom command, by the computer system, simultaneously, while the block diagram representation of the multi-physics system is displayed, and with no user action further to sending the zoom command and pointing to the location:

continuously and simultaneously detect:

the zoom command and the location pointed by the user using the pointing device, and a correspondence between the location pointed by the user and the graphical interior of the displayed block that represents the respective sub-system, and display, within the graphical interior of the displayed block diagram that represents the respective sub-system, the loaded preview of the block diagram representation of the respective sub-system, the loaded preview of the block diagram representation of the respective sub-system including graphical elements of a same nature as the graphical elements of the displayed block diagram representation of the multi-physics system, the graphical elements of the preview being thereby displayed in addition to the graphical elements of the displayed block diagram representation of the multi-physics system, the displaying of the loaded preview being controlled by the continuous detection of the zoom command, of the location pointed by the user and of the correspondence.

\* \* \* \* \*